(12) United States Patent
Rowell et al.

(10) Patent No.: US 10,622,723 B2
(45) Date of Patent: Apr. 14, 2020

(54) MEASURING SYSTEM AND MEASURING METHOD FOR OVER THE AIR MEASUREMENT OF ELECTRIC FIELD POTENTIAL

(71) Applicant: Rohde & Schwarz GmbH & Co. KG, Munich (DE)

(72) Inventors: Corbett Rowell, Munich (DE); Benoit Derat, Munich (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 210 days.

(21) Appl. No.: 15/933,023

(22) Filed: Mar. 22, 2018

(65) Prior Publication Data

US 2019/0148834 A1 May 16, 2019

(30) Foreign Application Priority Data

Nov. 10, 2017 (EP) .................... 17200967

(51) Int. Cl.
| | | |
|---|---|---|
| *H01Q 13/08* | (2006.01) | |
| *G01R 29/10* | (2006.01) | |
| *H01Q 21/00* | (2006.01) | |
| *H01Q 3/08* | (2006.01) | |
| *G01R 29/08* | (2006.01) | |
| *G01R 31/308* | (2006.01) | |
| *G01R 31/28* | (2006.01) | |

(52) U.S. Cl.
CPC ....... *H01Q 13/085* (2013.01); *G01R 29/0857* (2013.01); *G01R 29/0871* (2013.01); *G01R 29/10* (2013.01); *G01R 31/308* (2013.01); *H01Q 3/08* (2013.01); *H01Q 21/00* (2013.01); *G01R 31/2822* (2013.01)

(58) Field of Classification Search
CPC ........ H01Q 13/08; H01Q 21/00; G01R 29/08; G01R 29/10; G01R 31/30; G01R 31/28
USPC ........................................... 343/770
See application file for complete search history.

(56) References Cited

U.S. PATENT DOCUMENTS

| | | | |
|---|---|---|---|
| 9,322,864 B2 | 4/2016 | Foegelle | |
| 2013/0002275 A1* | 1/2013 | Min ................ | G01R 35/005 324/750.02 |
| 2013/0271317 A1* | 10/2013 | Goel ............... | G01S 19/23 342/357.62 |

FOREIGN PATENT DOCUMENTS

EP 3199958 A1 8/2017

* cited by examiner

*Primary Examiner* — Andrea Lindgren Baltzell
(74) *Attorney, Agent, or Firm* — Ditthavong & Steiner, P.C.

(57) ABSTRACT

A measuring system for over the air measurements on a device under test comprises an antenna module with at least one measuring antenna, a positioner, adapted to change a relative position of the device under test and the antenna module, resulting in a relative path of movement of the antenna module with regard to the device under test. Each measuring antenna comprises an integrated power detector diode. Each measuring antenna is adapted to determine at least two power values during the movement along the path of movement.

15 Claims, 6 Drawing Sheets

MEASURING SYSTEM AND MEASURING METHOD FOR OVER THE AIR MEASUREMENT OF ELECTRIC FIELD POTENTIAL

PRIORITY

This application claims priority of European patent application EP 17 200 967.2 filed on Nov. 10, 2017, which is incorporated by reference herewith.

FIELD OF THE INVENTION

The current invention relates to a measuring system and a measuring method, which perform over the air measurements on a device under test, emitting electromagnetic signals.

BACKGROUND OF THE INVENTION

In order to measure the electric field generated by a device under test, very complex hardware setups with a plurality of electric field sensors for each position to be measured, are necessary.

In order to alleviate this high hardware effort, systems using moveable sensors are used. For example, the document U.S. Pat. No. 9,322,864 B2 shows a measuring system comprising a plurality of sensors which are movable around a device under test. Still these systems have a significant hardware complexity.

Accordingly, one object of the invention is to provide a measuring system and measuring method, which allow for performing over the air measurements on a device under test while only requiring a low hardware complexity.

SUMMARY OF THE INVENTION

An inventive measuring system for over the air measurements on a device under test comprises an antenna module with at least one measuring antenna, a positioner, adapted to change a relative position of the device under test and the antenna module, resulting in a relative path of movement of the antenna module with regard to the device under test. Each measuring antenna comprises an integrated power detector diode. Each measuring antenna is adapted to determine at least two power values during the movement along the path of movement. By using power sensors for measuring the individual values, a low processing complexity of the resulting data is achieved. By recording at least two such power values along the path of movement with each antenna, the electrical field density can be determined with only a low hardware effort.

Advantageously, the measuring system additionally comprises an analyzer, connected to the antenna module and adapted to determine a power value function depended upon time and/or space during the movement along the path of movement. This allows for interpolating even positions/times, at which no measurement value has been determined.

Further advantageously, the analyzer is adapted to determine an electric field and/or a power density and/or a magnetic field and/or a vector of an electric field as a function of time and/or space, based upon the power value function. It is thereby possible to derive very accurate information about the signals emitted by the device under test without requiring a great hardware effort.

According to a further advantageous embodiment, the analyzer is adapted to determine a phase function dependent upon time and/or space, based upon the power value function, especially by an iterative approach. The knowledge of the measured power values allows for determining the phase of the signal emitted by the device under test. This approach only requires a low hardware effort.

Advantageously, the positioner is adapted to move the device under test. This allows a very simple construction of the positioner.

Alternatively, the positioner is adapted to move the antenna module. This allows for the use of a very simple device under test mount.

Advantageously, the positioner is adapted to perform the relative movement of the device under test and the antenna module, so that the device under test remains within the reactive near field of each antenna of the antenna module. This allows for a very low size of the measuring setup and thereby reduces the hardware effort further.

Advantageously, the antenna module comprises a single antenna. This reduces the hardware effort significantly. Alternatively, the antenna module comprises a one-dimensional antenna array, comprising a plurality of antennas arranged in a line. This allows for a parallel measurement of a significant number of values, while still keeping the system complexity low.

In a further alternative embodiment, the antenna module comprises a two-dimensional antenna array comprising a plurality of antennas arranged on a plane. This allows for performing a very high number of parallel measurements, while still keeping the hardware effort manageable.

According to a further alternative embodiment, the antenna module comprises a three-dimensional antenna array comprising a plurality of antennas arranged in a three-dimensional shape. This allows for adapting the shape of the antenna array to emission characteristics of the device under test.

In a further advantageous embodiment, the three-dimensional shape is a concave shape with regard to the device under test or resembles a part of a human head. This allows for performing standard-conformity tests without having to perform complex calculation steps.

According to a further advantageous embodiment, the antenna module comprises at least one Vivaldi antenna. Alternatively, all measuring antennas of the antenna array are Vivaldi antennas. This allows for a very simple construction of the antenna module.

Advantageously, the antenna module comprises at least one signal transmitter, adapted to transmit a signal, especially a continuous wave signal, towards the device under test. This allows for a very simple implementation of a measurement into the opposite direction.

An inventive measuring method for over the air measurements on a device under test comprises, relatively positioning an antenna module with at least one measuring antenna, wherein each antenna of the antenna module comprises a power detector diode and the device under test, in a first position, measuring, by the antenna module, a first power value, in the first position, relatively positioning the antenna module and the device under test, in a second position, and finally measuring, by the antenna module, a second power value.

By using power sensors for measuring the individual values, a low processing complexity of the resulting data is achieved. By recording at least two such power values along the path of movement with each antenna, the electrical field density can be determined with only low hardware effort.

BRIEF DESCRIPTION OF THE DRAWINGS

An exemplary embodiment of the invention is now further explained with respect to the drawings, in which.

DETAILED DESCRIPTION OF THE DRAWINGS

Figure 1:
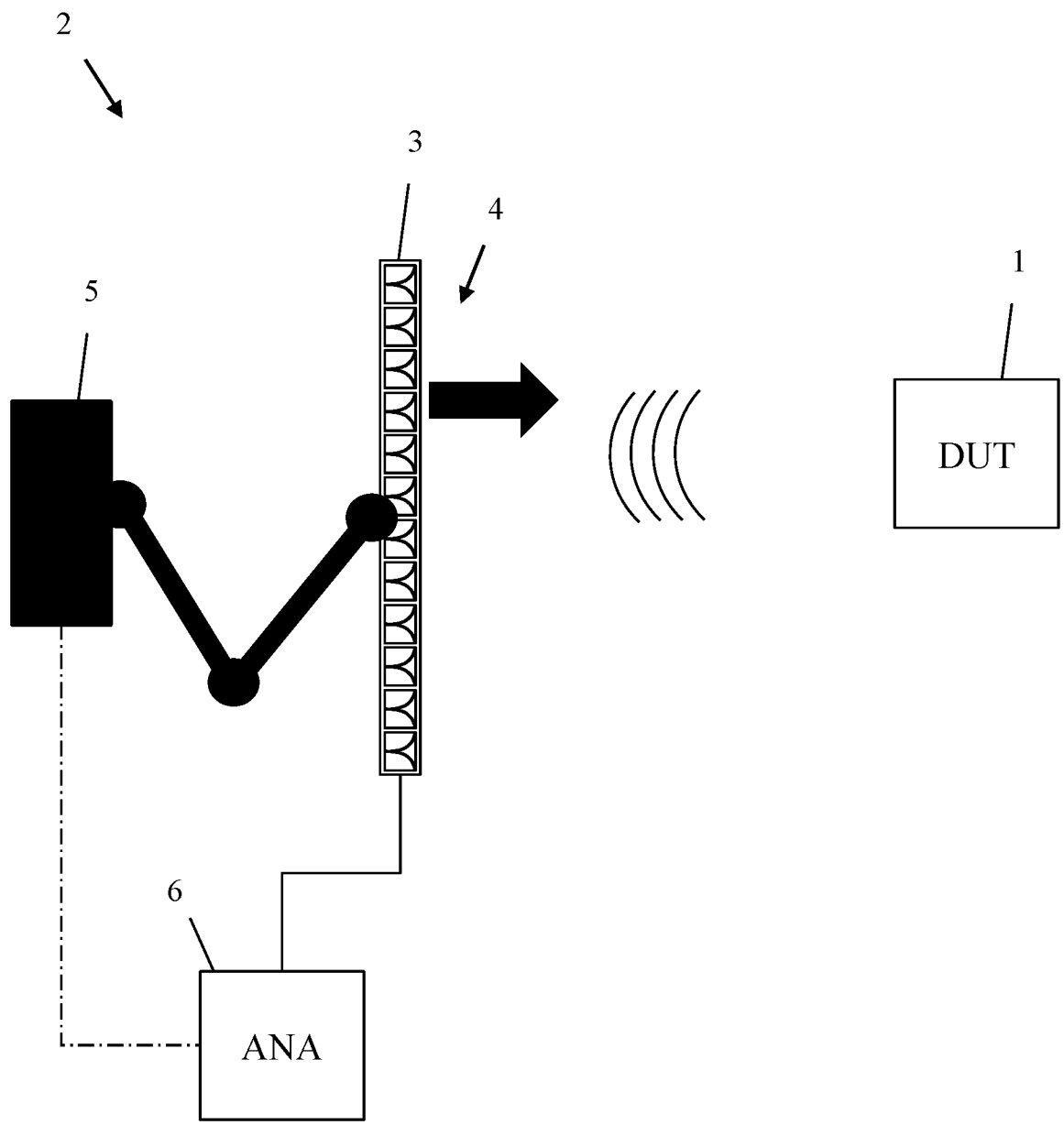
FIG. 1 shows a first embodiment of the inventive measuring system in a first position.
Figure 2:
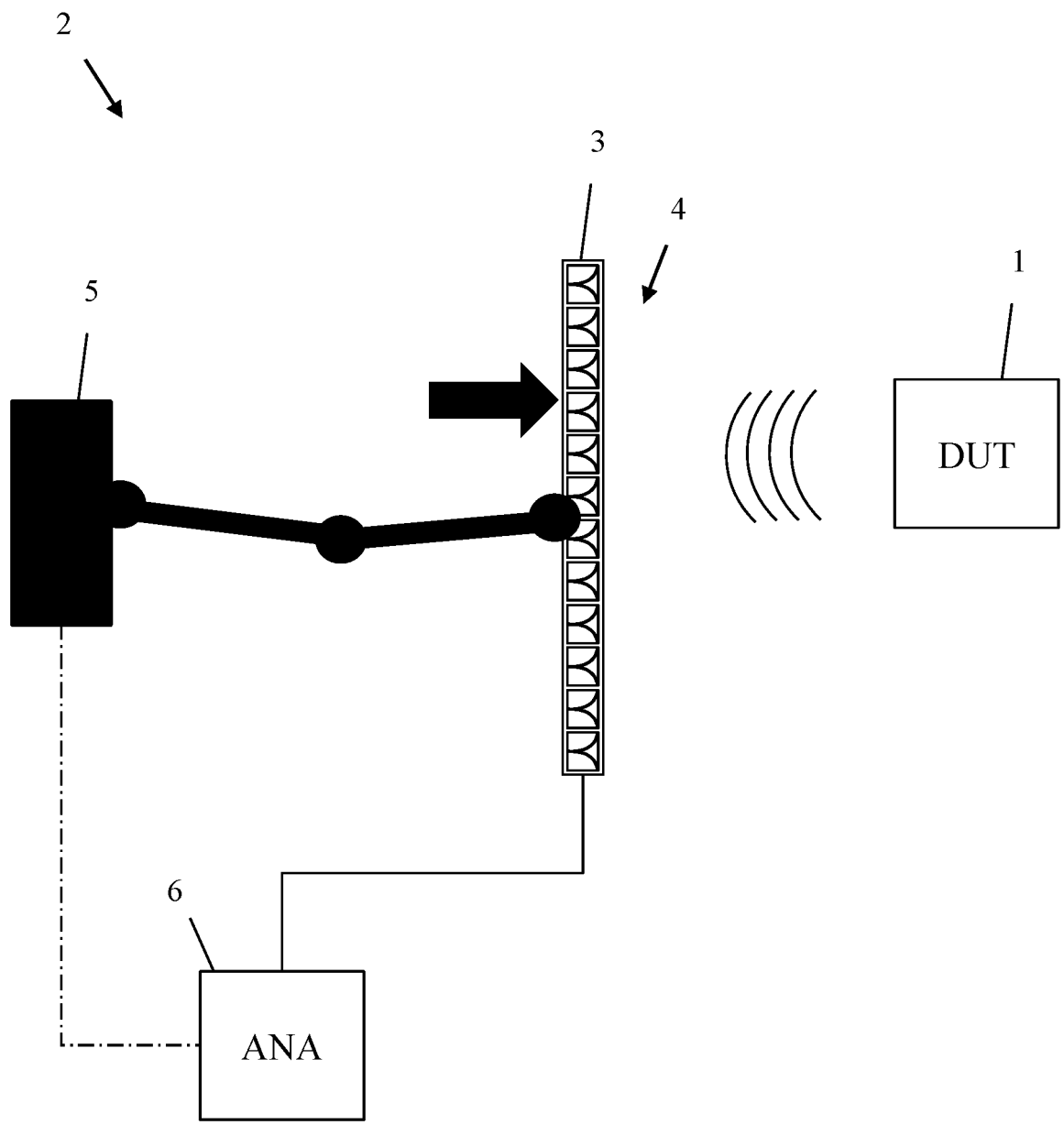
FIG. 2 shows the first embodiment of the inventive measuring system in a second position.

First, we demonstrate the construction and function of an embodiment of the inventive measuring system along FIG. 1 and FIG. 2. Further construction details are elaborated upon with regard to FIG. 3-FIG. 9. Finally, the function of an embodiment of the inventive measuring method is shown along FIG. 10. Similar entities and reference numbers in different figures have been partially omitted.

In FIG. 1, an embodiment of the inventive measuring system 2 is shown. The measuring system 2 measures signals emitted by a device under test 1. The measuring system 2 comprises an antenna module 3 with a number of measuring antennas 4. Moreover, the measuring system 2 comprises a positioner 5, which in this case holds and positions the antenna module 3. Alternatively, the positioner 5 can hold and position the device under test 1.

Moreover, the measuring system 2, in this embodiment, comprises an analyzer 6, which is connected to the antenna module 3. Optionally, the analyzer 6 can be additionally connected to the positioner 5 and control the operation of the positioner 5.

When performing measurement, the positioner 5 moves the antenna module 3 with regard to the device under test 1 resulting in a relative path of movement of the antenna module 3 with regard to the device under test 1. Such a movement is shown between FIG. 1 and FIG. 2. In a first position of the antenna module 3, as shown in FIG. 1, first measurements are performed, while in a second position as shown in FIG. 2, second measurements are performed. In each measurement, each measuring antenna 4 of the antenna module 3 measures a measuring value, especially a power value and hands these values on to the analyzer 6.

It is important to note that it is not necessary that the antenna module 3 remains stationary during performing the measurements. Especially, it is possible that while the antenna module 3 is moved, continuously measurements are performed.

From the recorded measuring values, especially power vales, the analyzer 6 determines a power value function dependent upon time and/or space during the movement along the path of movement. From this power value function, the analyzer 6 can moreover determine an electric field and/or a power density and/or a magnetic field and/or a vector of an electric field as a function of time and/or space. Especially, a Poynting Vector $\vec{V} \cdot \vec{S}$ and an energy flux gradient and a gradient of the electrical field $\vec{E}$ can be determined by the analyzer 6.

Especially, from these values, a power density function of the field emitted by the device under test 1 as well as a volumetric SAR can be determined. Finally, it is possible to determine the exact phase of the signal emitted by the device under test, since the power values at different positions along with knowledge of the wavelength of the signal emitted by the device under test give all necessary information for determining the phases. For performing the phase determination, especially an iterative method of using each plane or position in time as a phase reference is possible.

The analyzer 6 is moreover adapted to determine the respective values not only in a volume of space, in which measurements have been performed, but also to extrapolate for areas not measured. Especially, an extrapolation of the values directly at the surface of the device under test 1 can be performed.

Especially, the measuring system 2 is set up, so that the antenna module 3 and especially each antenna 4 of the antenna module 3 remains within reactive near field distance to the device under test 1, thereby allowing for a very small necessary space of the measuring system.

Figure 3:
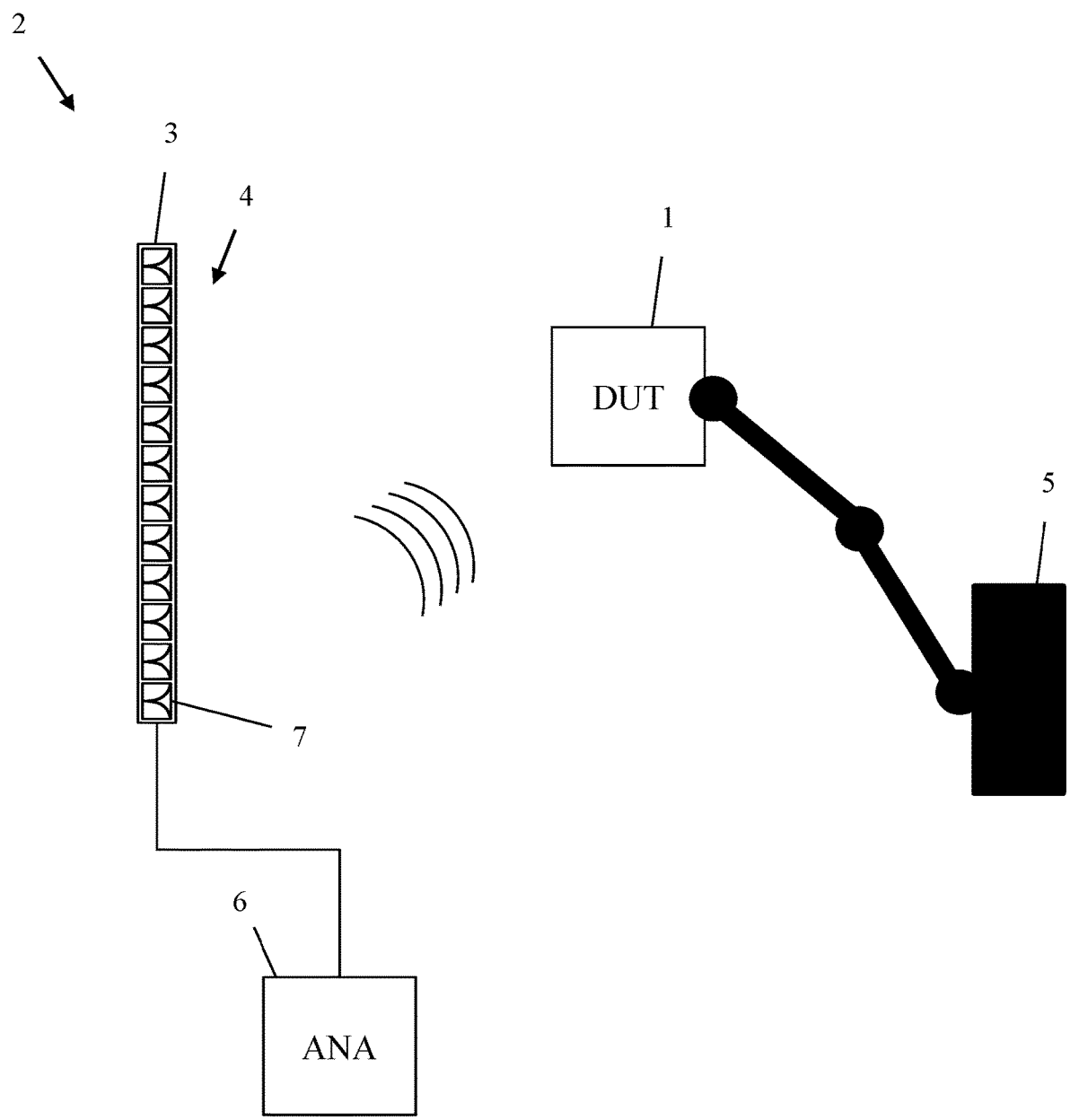
FIG. 3 shows a second embodiment of the inventive measuring system.

In FIG. 3, a further embodiment of the measuring system 2 is shown. Here, the device under test 1 is held by the positioner 5, in order to perform the relative movement of the antenna module 3 and the device under test 1.

Moreover, in this embodiment, the antenna module 3 additionally comprises a transmitter 7, which is adapted to transmit a measuring signal, especially a continuous wave signal towards the device under test 1. This allows for performing measurements in the opposite measuring direction. Apart from the above-mentioned changes, this embodiment is identical to the embodiment shown in FIG. 1 and FIG. 2.

Additionally it is possible to have the antenna module 3 as well as the device under test 1 connected to a positioner in order to perform relative movements.

Figure 4:
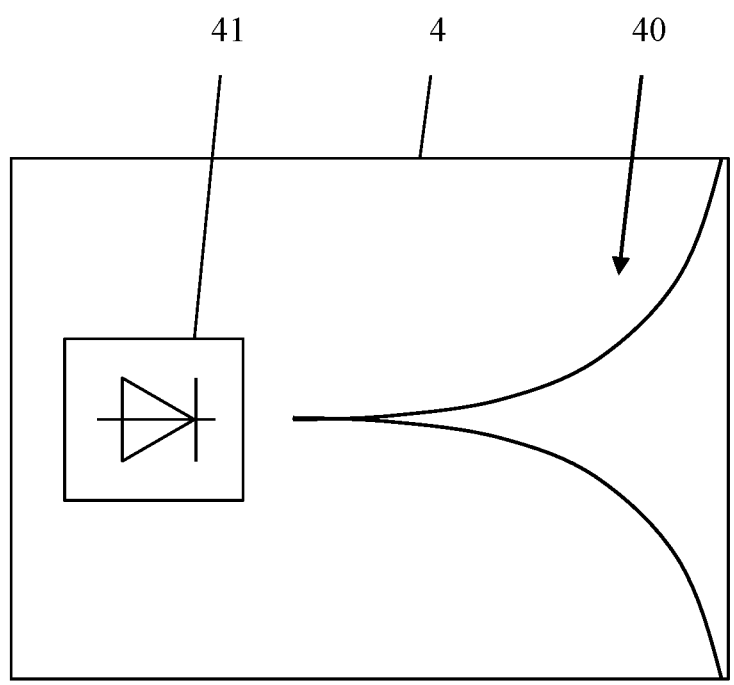
FIG. 4 shows a third embodiment of the inventive measuring system in a detail view, showing only a single measuring antenna.

In FIG. 4, a general diagram of a measuring antenna 4 of the antenna module 3 is shown. The measuring antenna 4 comprises a Vivaldi antenna 40 and a power detector diode 41, which is connected to the Vivaldi antenna 40. A signal received by the Vivaldi antenna 40 is handed on to the power detector diode 41, which determines the power of the received signal. This power value is handed on to the analyzer 6, as shown in FIG. 1-3.

In FIG. 5-9 different embodiments of the measuring system with regard to the antenna module construction are shown.

Figure 5:
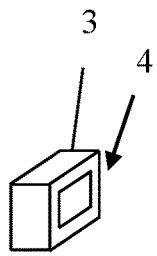
FIG. 5 shows a forth embodiment of the inventive measuring system in a detail view, showing only the antenna module.

In FIG. 5, a very simple antenna module 3 comprising only a single measuring antenna 4 is shown.

Figure 6:
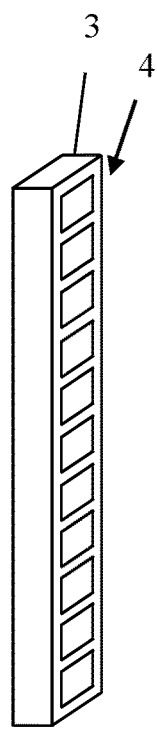
FIG. 6 shows a fifth embodiment of the inventive measuring system in a detail view, showing only the antenna module.

In FIG. 6, a more complex antenna module, with a plurality of measuring antennas 4 arranged as a one-dimensional antenna array is shown.

Figure 7:
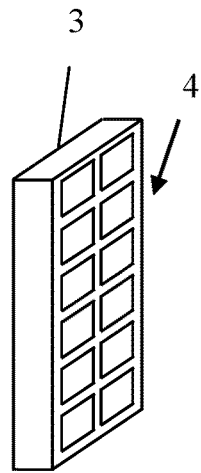
FIG. 7 shows a sixth embodiment of the inventive measuring system in a detail view, showing only the antenna module.

In FIG. 7, the antenna module 3 comprises a plurality of antennas arranged in a two-dimensional antenna array.

Figure 8:
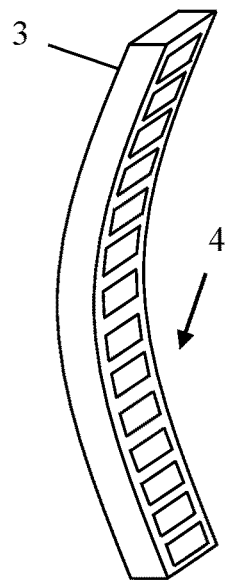
FIG. 8 shows a seventh embodiment of the inventive measuring system in a detail view, showing only the antenna module.

In FIG. 8, the antenna module 3 comprises a plurality of measuring antennas 4, arranged in a three-dimensional array, which forms a concave shape with regard to the direction of the device under test. This is especially useful for small devices under test.

Figure 9:
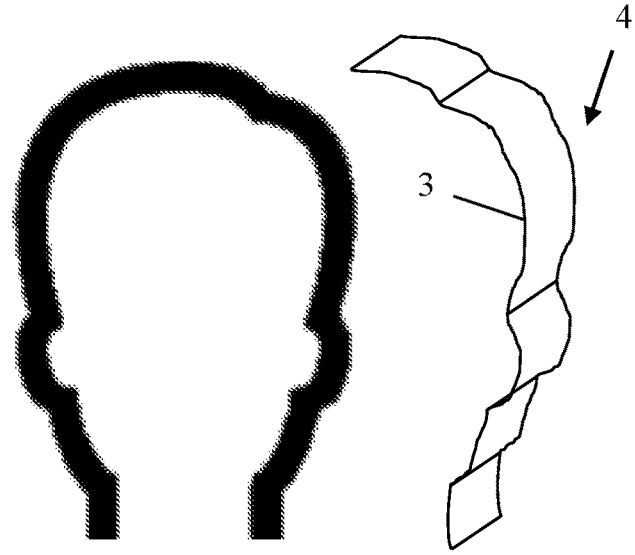
FIG. 9 shows an eighth embodiment of the inventive measuring system in a detail view, showing only the antenna module.

In FIG. 9, an antenna module 3 comprising a plurality of measuring antennas 4, which are arranged in a complex three-dimensional pattern, is shown. Here the measuring antennas 4 are arranged to resemble the shape of a human head. This serves the purpose of measuring the emissions of the device under test in a standard-conformity test when determining the amount of radiation entering the human body at different distances. In FIG. 9, the individual measuring antennas 4 are not displayed individually, for reasons of clarity of the figure.

Figure 10:
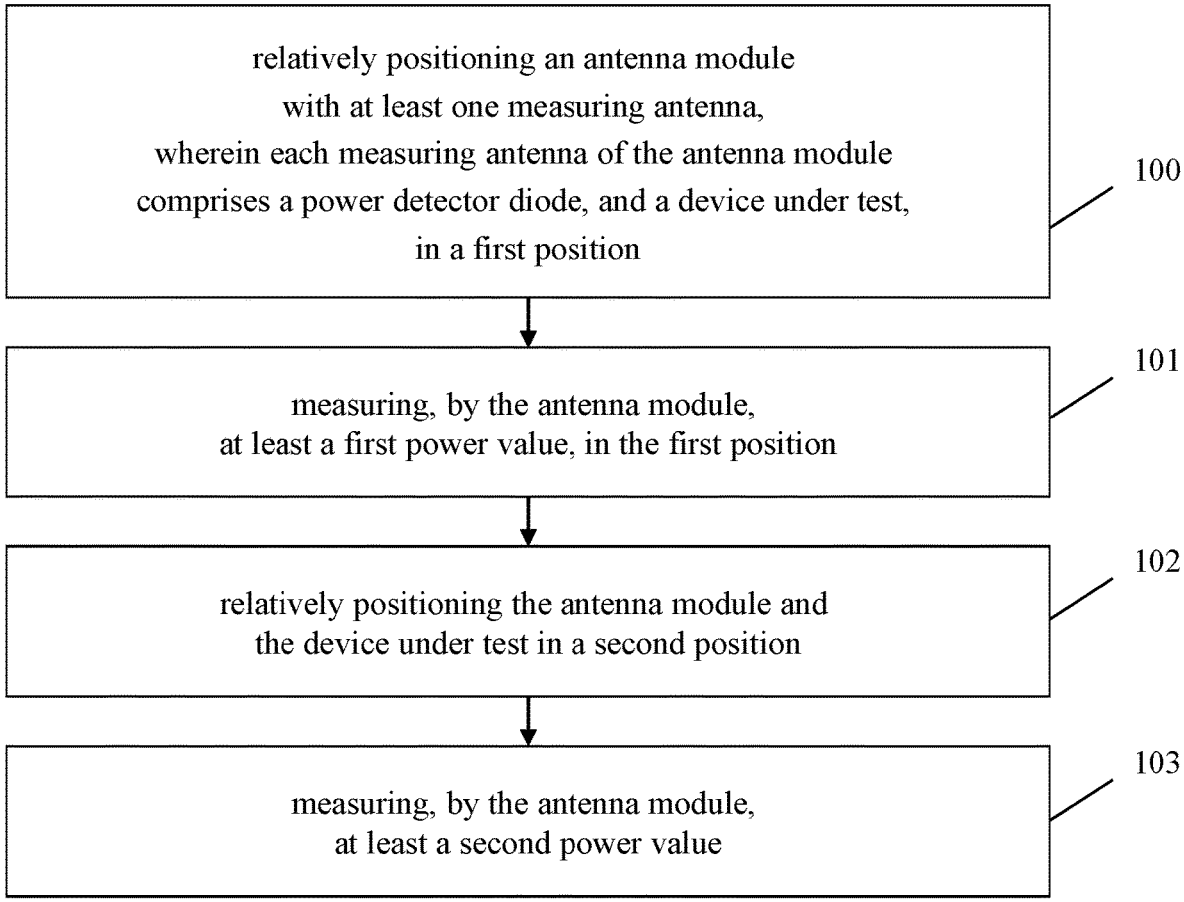
FIG. 10 shows an embodiment of the inventive measuring method in a flow diagram.

Finally, in FIG. 10, an embodiment of the inventive measuring method is shown. In a first step 100, an antenna module and a device under test are relatively positioned in a first position. The antenna module comprises at least one measuring antenna, and each measuring antenna of the antenna module comprises a power detector diode. In a second step 101, the antenna module measures at least a first power value in the first position. In a third step 102, the antenna module and the device under test are relatively positioned in a second position. In a final forth step 103, the antenna module measures at least a second power value.

The invention is not limited to the examples and especially not to a specific number of measuring antennas or shapes of the antenna module. The characteristics of the exemplary embodiments can be used in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed:

1. Measuring system for over the air measurements on a device under test, comprising:
    an antenna module with at least one measuring antenna, and
    a positioner, adapted to change a relative position of the device under test and the antenna module, resulting in a relative path of movement of the antenna module with regard to the device under test,
    wherein each measuring antenna comprises an integrated power detector diode, and
    wherein each measuring antenna is adapted to determine at least two power values during the movement along the path of movement.

2. Measuring system according to claim 1,
    wherein the measurement system comprises an analyzer, connected to the antenna module, adapted to determine a power value function dependent upon time and/or space during the movement along the path of movement.

3. Measuring system according to claim 2,
    wherein the analyzer is adapted to determine an electric field and/or a power density and/or a magnetic field and/or a vector of an electric field as a function of time and/or space, based upon the power value function.

4. Measuring system according to claim 2,
    wherein the analyzer is adapted to determine a phase function dependent upon time and/or space, based upon the power value function, especially by an iterative approach.

5. Measuring system according to claim 1,
    wherein the positioner is adapted to move the device under test.

6. Measuring system according to claim 1,
    wherein the positioner is adapted to move the antenna module.

7. Measuring system according to claim 1,
    wherein the positioner is adapted to perform the relative movement of the device under test and the antenna module so that the device under test remains within the reactive nearfield of each antenna of the antenna module.

8. Measuring system according to claim 1,
    wherein the antenna module comprises a single antenna.

9. Measuring system according to claim 1,
    wherein the antenna module comprises a one-dimensional antenna array, comprising a plurality of antennas arranged in a line.

10. Measuring system according to claim 1,
    wherein the antenna module comprises a two-dimensional antenna array comprising a plurality of antennas arranged on a plane.

11. Measuring system according to claim 1,
    wherein the antenna module comprises a three-dimensional antenna array comprising a plurality of antennas arranged in a three-dimensional shape.

12. Measuring system according to claim 10,
    wherein the three-dimensional shape is a concave shape with regard to the device under test or resembles a part of a human head.

13. Measuring system according to claim 1,
    wherein the antenna module comprises at least one Vivaldi antenna, or
    wherein all measurement antennas of the antenna module are Vivaldi antennas.

14. Measuring system according to claim 1,
    wherein the antenna module comprises at least one signal transmitter, adapted to transmit a signal, especially a continuous wave signal, towards the device under test.

15. Measuring method for over the air measurements on a device under test, comprising:
    relatively positioning an antenna module with at least one measuring antenna, wherein each measuring antenna of the antenna module comprises a power detector diode, and the device under test, in a first position,
    measuring, by the antenna module, at least a first power value, in the first position,
    relatively positioning the antenna module and the device under test, in a second position, and
    measuring, by the antenna module, at least a second power value.

* * * * *